(12) United States Patent
Chen et al.

US008636911B2

(10) Patent No.: US 8,636,911 B2
(45) Date of Patent: Jan. 28, 2014

(54) PROCESS FOR MEMS SCANNING MIRROR WITH MASS REMOVE FROM MIRROR BACKSIDE

(75) Inventors: Jun Chen, Fremont, CA (US); Guomin Mao, San Jose, CA (US); Tom Zhong, Saratoga, CA (US); Wei Cao, San Jose, CA (US); Yee-Chung Fu, Fremont, CA (US); Chyu-Jiuh Torng, Pleasanton, CA (US)

(73) Assignees: MagIC Technologies, Inc., Milpitas, CA (US); Advanced Numicro Systems, Inc., San Jose, CA (US)

( * ) Notice: Subject to any disclaimer, the term of this patent is extended or adjusted under 35 U.S.C. 154(b) by 578 days.

(21) Appl. No.: 12/924,873

(22) Filed: Oct. 7, 2010

(65) Prior Publication Data

US 2012/0085728 A1 Apr. 12, 2012

(51) Int. Cl.
*B81C 1/00* (2006.01)
(52) U.S. Cl.
USPC ........ 216/2; 216/24; 216/63; 216/66; 216/67; 216/79; 438/29; 438/706; 438/719
(58) Field of Classification Search
None
See application file for complete search history.

(56) References Cited

U.S. PATENT DOCUMENTS

| | | | |
|---|---|---|---|
| 5,914,801 A * | 6/1999 | Dhuler et al. ................. | 359/230 |
| 6,087,747 A * | 7/2000 | Dhuler et al. .................. | 310/90 |
| 6,201,629 B1 * | 3/2001 | McClelland et al. ...... | 359/223.1 |
| 6,628,041 B2 * | 9/2003 | Lee et al. ..................... | 310/309 |
| 6,827,866 B1 * | 12/2004 | Novotny ........................... | 216/2 |
| 6,905,614 B1 * | 6/2005 | Novotny ........................... | 216/2 |
| 6,914,710 B1 * | 7/2005 | Novotny et al. ............... | 359/291 |
| 6,963,679 B1 * | 11/2005 | Novotny et al. ................. | 385/18 |
| 7,014,115 B2 * | 3/2006 | Fu ................................ | 235/454 |
| 7,187,488 B2 | 3/2007 | Fu | |
| 7,190,854 B1 | 3/2007 | Novotny et al. | |
| 7,217,587 B2 | 5/2007 | Fu | |
| 7,224,097 B2 * | 5/2007 | Obi et al. ....................... | 310/309 |
| 7,542,188 B2 * | 6/2009 | Zhou et al. .................. | 359/199.1 |
| 7,605,966 B2 * | 10/2009 | Tani et al. ................... | 359/224.1 |
| 7,616,371 B2 | 11/2009 | Fu | |
| 7,710,627 B2 | 5/2010 | Yoon et al. | |
| 7,824,945 B2 * | 11/2010 | Chang et al. .................... | 438/51 |
| 7,872,394 B1 | 1/2011 | Gritters et al. | |
| 8,035,874 B1 * | 10/2011 | Fu .............................. | 359/199.2 |
| 8,107,157 B2 * | 1/2012 | Tsuboi et al. ................. | 359/291 |
| 8,353,600 B1 * | 1/2013 | Fu ................................ | 359/849 |
| 8,378,434 B2 * | 2/2013 | Krylov et al. ................. | 257/415 |
| 2001/0021058 A1 * | 9/2001 | McClelland et al. ......... | 359/223 |
| 2001/0022682 A1 * | 9/2001 | McClelland et al. ......... | 359/280 |
| 2001/0034938 A1 * | 11/2001 | Behin et al. .................... | 29/847 |
| 2002/0005976 A1 * | 1/2002 | Behin et al. .................... | 359/254 |
| 2002/0050744 A1 * | 5/2002 | Bernstein et al. ............... | 310/12 |
| 2002/0118850 A1 * | 8/2002 | Yeh et al. ..................... | 381/313 |
| 2003/0007262 A1 * | 1/2003 | Tsuboi et al. ................. | 359/847 |

(Continued)

OTHER PUBLICATIONS

PCT Search Report—PCT/US 11/01704, Mail date—Feb. 14, 2012, Magic Technologies, Inc.

*Primary Examiner* — Allan Olsen
(74) *Attorney, Agent, or Firm* — Saile Ackerman LLC; Stephen B. Ackerman; Rosemary L. S. Pike

(57) ABSTRACT

Two methods of fabricating a MEMS scanning mirror having a tunable resonance frequency are described. The resonance frequency of the mirror is set to a particular value by mass removal from the backside of the mirror during fabrication.

19 Claims, 8 Drawing Sheets

(56) References Cited

U.S. PATENT DOCUMENTS

| | | | |
|---|---|---|---|
| 2004/0032634 A1* | 2/2004 | Hah et al. | 359/224 |
| 2005/0139678 A1* | 6/2005 | Helsel et al. | 235/462.37 |
| 2005/0156481 A1* | 7/2005 | Zhou et al. | 310/309 |
| 2005/0269655 A1* | 12/2005 | Fu | 257/415 |
| 2006/0166444 A1* | 7/2006 | Fu | 438/269 |
| 2007/0216986 A1 | 9/2007 | Huber et al. | |
| 2008/0279498 A1 | 11/2008 | Sampsell et al. | |
| 2009/0185253 A1* | 7/2009 | Tani et al. | 359/221.2 |
| 2010/0006958 A1* | 1/2010 | Krylov et al. | 257/415 |
| 2011/0136283 A1* | 6/2011 | Gritters et al. | 438/50 |
| 2011/0268384 A1* | 11/2011 | Akkaya et al. | 385/12 |
| 2012/0080612 A1* | 4/2012 | Grego et al. | 250/458.1 |

\* cited by examiner

PROCESS FOR MEMS SCANNING MIRROR WITH MASS REMOVE FROM MIRROR BACKSIDE

BACKGROUND OF THE INVENTION (1) Field of the Invention

This invention is related to MEMS devices, and more particularly, to methods of forming a MEMS scanning mirror with tunable resonance frequency.

(2) Description of the Related Art

Micro-electro-mechanical systems (MEMS), the smallest functional machines that can be manufactured currently, are made up of components ranging from a few micrometers to several millimeters in size. MEMS, a rapidly growing semiconductor field, have many important practical and potential commercial applications. MEMS scanning mirrors have been found in many applications such as barcodes, laser printers, projection displays, and rear projection TV's, for example. A MEMS scanning mirror is formed by the mirror itself, anchors, and a spring coupling the mirror and the anchors. Such a MEMS scanning mirror could be driven by either magnetic or electrostatic force. The MEMS scanning mirror device of the present invention is based on an electrostatic comb actuator.

A MEMS scanning mirror is usually driven at its resonance frequency under alternating current (AC) to achieve a high scanning angle. For different applications and products, the required resonance frequency might be different. The resonance frequency of a MEMS scanning mirror depends on the mirror's mass, its dimension, and materials properties such as the elastic modulus. The resonance frequency can be predetermined through mask design and it can be adjusted by mirror mass change during mirror fabrication.

Adjusting resonance frequency through mirror mass change has been proven efficient. U.S. Patent Application 2009/0080051 to Yoon et al discloses removing a portion of the backside of a moving plate to a predetermined depth to reduce the weight of the moving plate and increase resonance frequency. However, the etching is performed without patterning.

U.S. Pat. No. 7,187,488 and U.S. Patent Application 2007/0117051, both to Fu, disclose trimming a sacrificial portion of a mirror by laser beam or ion beam. Since there is no etch selectivity with those methods, etch uniformity and frequency control can be very poor.

U.S. Pat. No. 7,217,587 (Fu) notes removing a mass by laser trimming, but using different steps from the invention.

SUMMARY OF THE INVENTION

It is the primary objective of the present invention to set a particular resonance frequency for a MEMS scanning mirror.

It is another objective of the invention to set a particular resonance frequency for a MEMS scanning mirror through mirror backside mass removal.

In accordance with the objectives of the invention, a method of fabricating a MEMS scanning mirror having a tunable resonance frequency is achieved. A silicon-on-insulator wafer is provided comprising a top silicon layer, a bottom silicon layer, and a silicon dioxide layer between the top and bottom silicon layers. A silicon dioxide hard mask is formed on the bottom silicon layer and patterned. Portions of the bottom silicon layer and the silicon dioxide layer are etched away from a backside of the silicon-on-insulator wafer and portions of the top silicon layer are etched away from the backside directly underlying the MEMOS scanning mirror wherein choosing a depth of the portions of the top silicon layer achieves the tunable resonance frequency for the MEMS scanning mirror. The bottom and top silicon layers are etched using the silicon dioxide hard mask and the silicon dioxide layer as hard masks and the silicon dioxide layer is etched using the silicon layer as a hard mask.

Also in accordance with the objectives of the invention, a method of setting a particular resonance frequency for a MEMS scanning mirror through mirror backside mass removal is achieved. A silicon-on-insulator wafer is provided comprising a top silicon layer, a bottom silicon layer, and a silicon dioxide layer between the top and bottom silicon layers. A top hard mask is formed on the top silicon layer. A bottom hard mask is formed on the bottom silicon layer having an opening for a mass removal area. The bottom hard mask and bottom silicon layer are coated with a photoresist layer. The photoresist layer is patterned to provide openings in the mass removal area and in other areas. The bottom silicon layer is first partially etched away where it is not covered by the photoresist layer and bottom hard mask in the mass removal area. Next, the bottom hard mask is removed where it is not covered by the photoresist layer. A second etching away of the bottom silicon layer where it is not covered by the photoresist layer stops at the silicon dioxide layer in the mass removal area wherein a portion of the bottom silicon layer remains covering the silicon dioxide layer in all other areas. Then, the silicon dioxide layer exposed in the mass removal area is removed and the photoresist layer is stripped. A third etching away of the bottom silicon layer etches into the top silicon layer to a predetermined depth in the mass removal area and stops at the silicon dioxide layer in the other areas. The bottom hard mask is removed. A glass wafer is anodically bonded to the bottom silicon layer. A silicon wafer is temporarily bonded to the glass wafer. Finally, the top silicon layer is etched through, the top hard mask is removed, and metal is deposited to form a MEMS scanning mirror.

Also in accordance with the objectives of the invention, another method of setting a particular resonance frequency for a MEMS scanning mirror through mirror backside mass removal is achieved. A silicon-on-insulator wafer is provided comprising a top silicon layer, a bottom silicon layer, and a silicon dioxide layer between the top and bottom silicon layers. A top hard mask on the top silicon layer and a bottom hard mask are formed on the bottom silicon layer. The bottom hard mask and bottom silicon layer are coated with a photoresist layer which is patterned to provide an opening for a mass removal area. The bottom silicon layer is first etched away where it is not covered by the photoresist layer in the mass removal area, stopping at the silicon dioxide layer. Next, the silicon dioxide layer exposed in the mass removal area is removed and the photoresist layer is stripped. A second etching away of the bottom silicon layer where it is not covered by the bottom hard mask etches into the top silicon layer in the mass removal area and stops at the silicon dioxide layer in all other areas. The silicon dioxide layer and bottom hard mask are removed. A glass wafer is anodically bonded to the bottom silicon layer. A silicon wafer is temporarily bonded to the glass wafer. Finally, the top silicon layer is etched through, the top hard mask is removed, and metal is deposited to form a MEMS scanning mirror.

BRIEF DESCRIPTION OF THE DRAWINGS

In the accompanying drawings forming a material part of this description, there is shown.

DETAILED DESCRIPTION OF THE INVENTION

In the prior art, creating a sacrificial portion on the mirror has been provided as a way to change mirror mass and, in turn, to adjust resonance frequency of the MEMS scanning mirror. But this sacrificial portion is on the same layer as the spring and comb teeth. If reactive ion etching (RIE) were used here to etch the sacrificial portion, the spring and the comb teeth might also be affected. In the prior art, if the mirror mass is removed from the backside, the mass removal process is decoupled from the spring and comb teeth process. The backside mass removal can be realized by RIE, ion beam etching (IBE), or laser beam etching.

The mass removal process of the present invention can be realized mainly by deep silicon etching. The etch profile can be controlled very well in the handle silicon and also in the active silicon layer. Both silicon and silicon dioxide etching is performed from the backside, using either Si or $SiO_2$ as a hard mask when the other material is etched. The structure release step is partially performed during the backside $SiO_2$ etch. With the help of advanced metrology, rework could achieve an accuracy of frequency control within 1 Hz.

Figure 1:
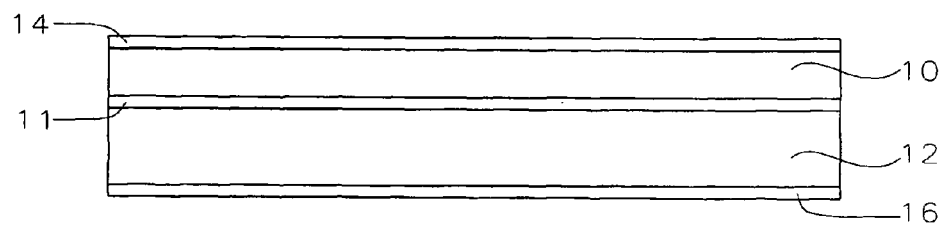
FIGS. 1-10 are cross-sectional representations of steps in a first preferred embodiment of the present invention.

Two preferred process flow embodiments are presented here, as shown in FIGS. 1-10 and FIGS. 11-22. Referring now more particularly to FIG. 1 in the first preferred embodiment of the invention, there is shown a silicon-on-insulator (SOI) wafer. For example, the top silicon portion of the wafer 10, which will form the active silicon layer, is between about 100 and 200 microns in thickness. The middle silicon dioxide layer 11 is about 2 microns thick. The middle silicon dioxide layer is called the buried-in oxide (BOX) layer. The bottom silicon layer 12 is between about 300 and 400 microns thick. Top and bottom silicon dioxide layers 14 and 16, respectively, are formed to a thickness of about 2 microns on the top and bottom silicon layers.

Figure 2:
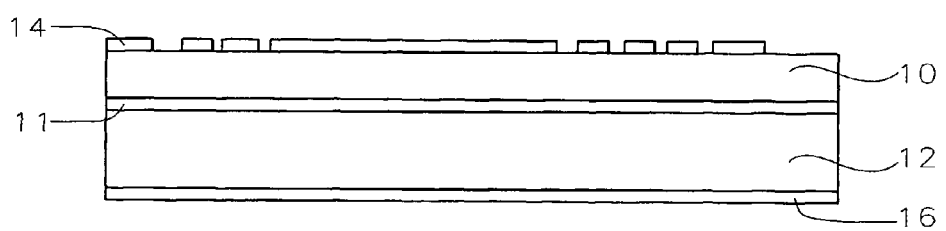

Referring now to FIG. 2, the top silicon dioxide layer is patterned using photoresist and reactive ion etching (RIE). The top silicon dioxide layer 14 forms a hard mask defining openings for the mirror, top comb teeth, spring, and alignment mark.

Figure 3:
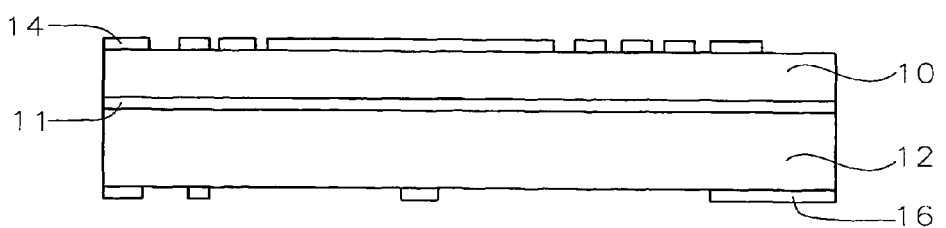

Next, the bottom silicon dioxide layer 16 is patterned using photoresist and RIE to form the bottom hard mask defining the backside pattern, including the mass remove area, isolation line, and pad. This is shown in FIG. 3.

Figure 4:
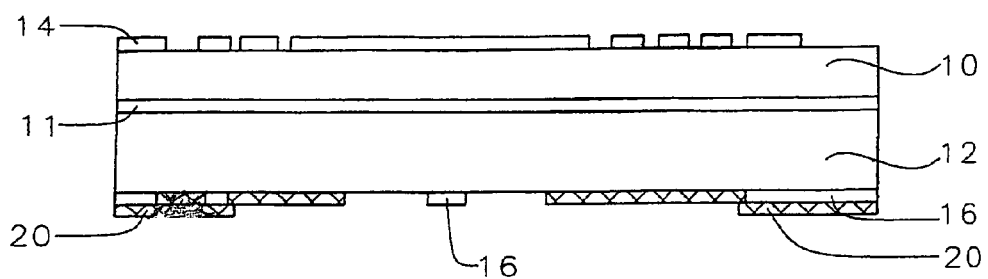
Figure 5:
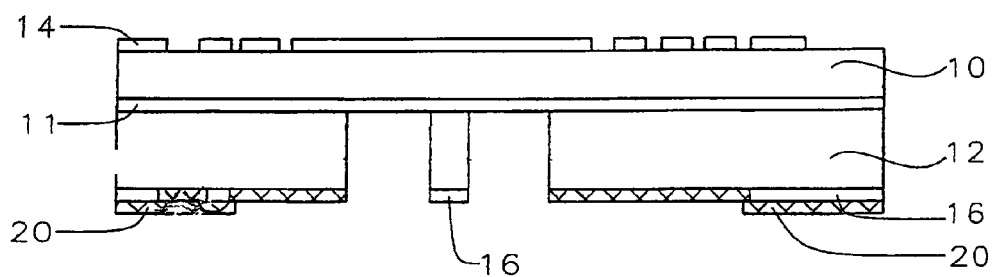

Referring now to FIG. 4, a photoresist layer 20 is applied to the backside of the wafer and patterned to define the mirror mass remove area. A deep silicon etch is performed in the mass remove area not covered by the photoresist 20 and the bottom oxide layer 16, as shown in FIG. 5. The deep silicon etch stops at the BOX layer 11. The deep silicon etch can preferably be a reactive ion etch (RIE), or it could be an ion beam etch or laser beam removal.

Figure 6:
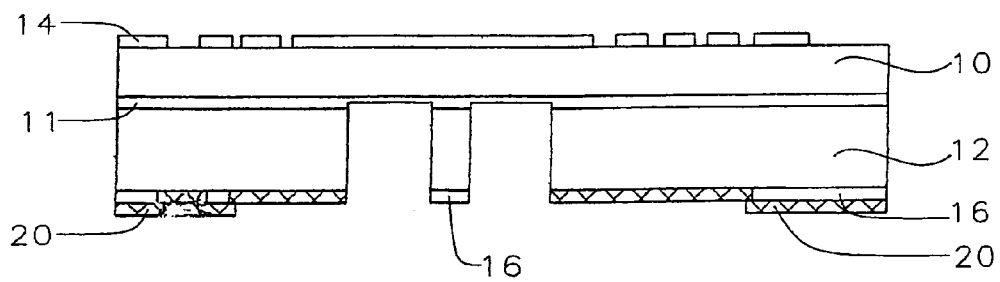

As shown in FIG. 6, the etching continues to partially etch into the BOX layer 11. For example, if the original thickness of the BOX layer is 2 µm, the remaining BOX thickness after the backside Si etch should be around 1 µm, which is mainly controlled by selectivity and etch time. Now, the photoresist 20 is removed by using a PR stripping step.

Figure 7:
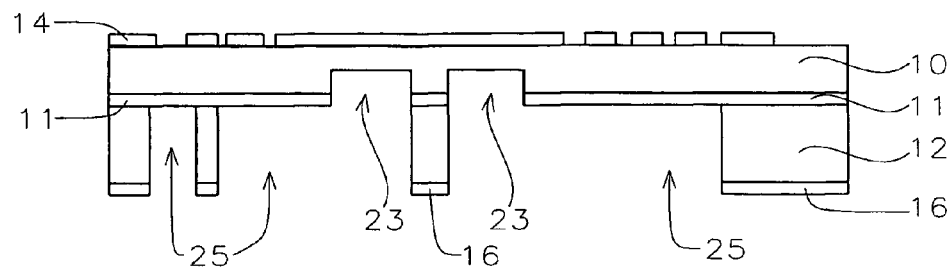

A second deep silicon etch is performed from the backside of the wafer, as shown in FIG. 7. The etch stops at the BOX layer 11 to form recessed areas 25. In the previously recessed areas, the etch continues through the partial BOX layer 11 into silicon 10 to form recessed areas 23.

Figure 8:
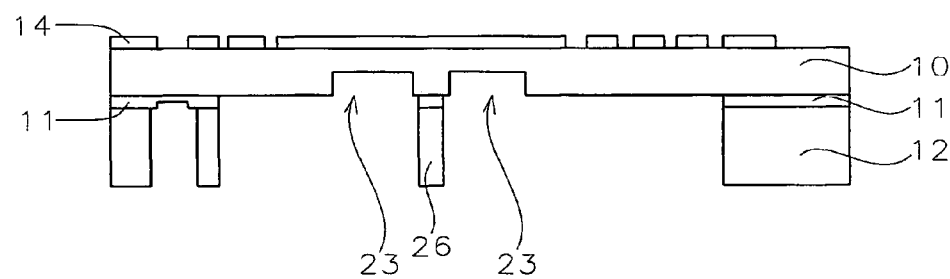

Next, in a first structure release step, the bottom silicon dioxide layer 16 is removed by an oxide etch, as shown in FIG. 8. This oxide etch also removes exposed BOX 11.

Figure 9:
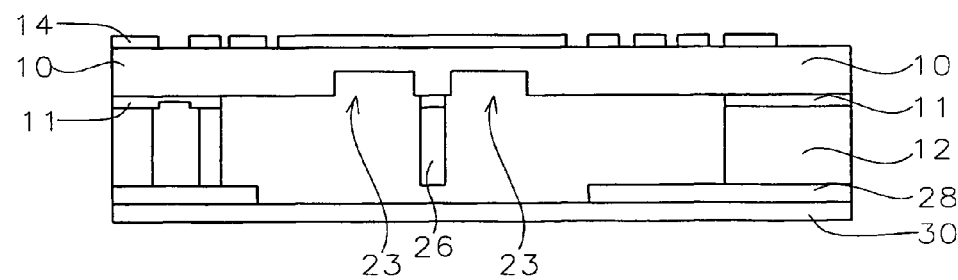

Now, as shown in FIG. 9, a glass layer 28 is bonded to the silicon-on-insulator wafer 10/11/12 using anodic bonding. A silicon wafer 30 is temporarily bonded to the glass 28.

Figure 10:
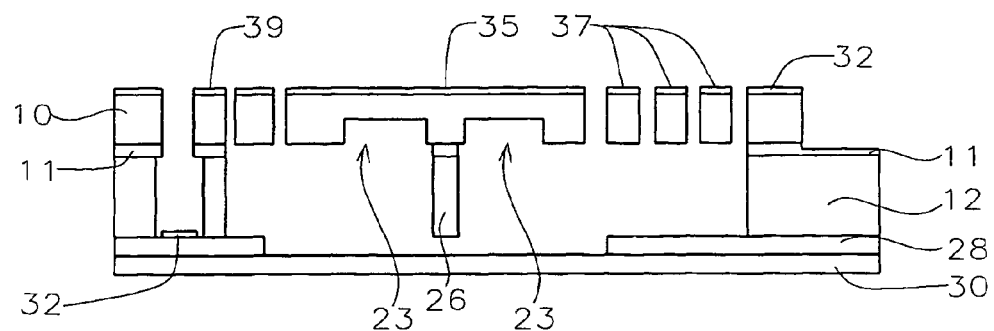

As illustrated in FIG. 10, a second structure release step is performed. A deep silicon etch is performed from the topside of the wafer where the silicon layer 10 is not covered by the hard mask 14. The top silicon dioxide layer 16 is removed, followed by metal deposition 32 to form the MEMS scanning mirror of the invention. FIG. 10 illustrates the mirror 35, comb teeth 37, and the anchor 39.

Figure 11:
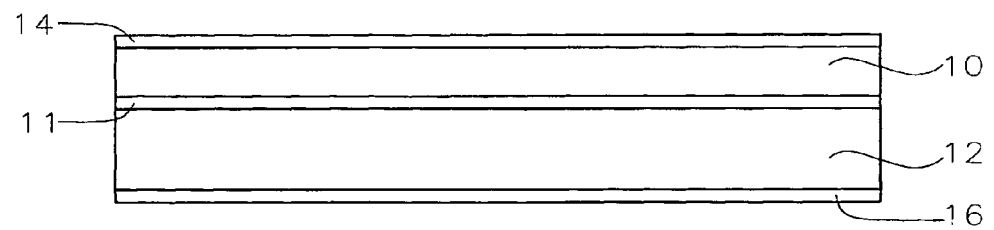
FIGS. 11-22 are cross-sectional representations of steps in a second preferred embodiment of the present invention.

A second preferred embodiment of the present invention will be described with reference to FIGS. 11-22. Referring now more particularly to FIG. 11, there is shown a silicon-on-insulator (SOI) wafer. For example, the top silicon portion of the wafer 10, which will form the active silicon layer, is between about 100 and 200 microns in thickness. The middle silicon dioxide layer 11 is about 2 microns thick. The bottom silicon layer 12 is between about 300 and 400 microns thick. Top and bottom silicon dioxide layers 14 and 16, respectively, are formed to a thickness of about 2 microns on the top and bottom silicon layers.

Figure 12:
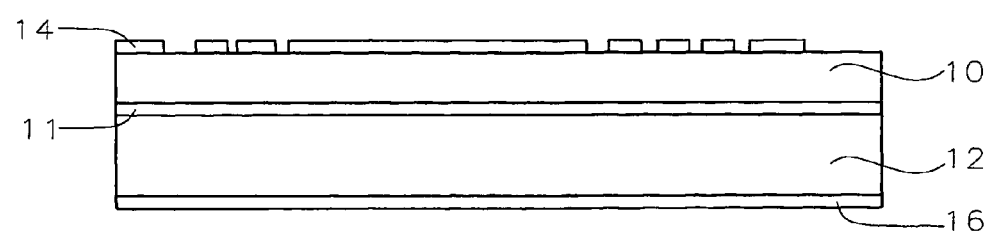

Referring now to FIG. 12, the top silicon dioxide layer is patterned using photoresist and reactive ion etching (RIE). The top silicon dioxide layer 14 forms a hard mask defining openings for the mirror, top comb teeth, spring, and alignment mark.

Figure 13:
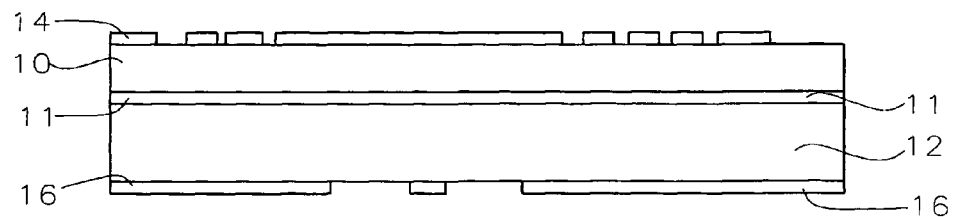

Next, the bottom silicon dioxide layer 16 is patterned using photoresist and RIE to form the bottom hard mask defining the mass remove area. This is shown in FIG. 13.

Figure 14:
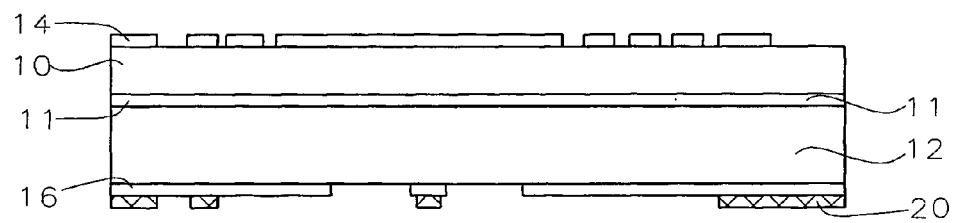
Figure 15:
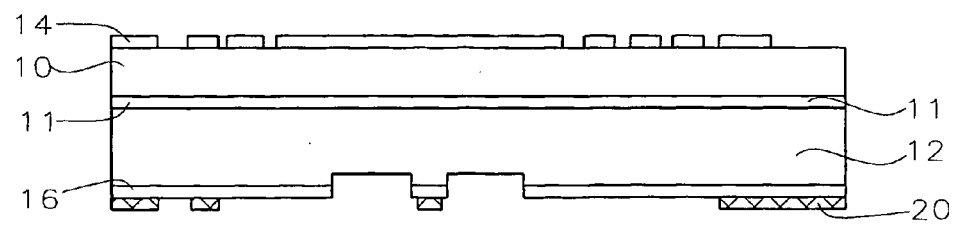

Referring now to FIG. 14, a photoresist layer 20 is applied to the backside of the wafer and patterned to define the cavity, anchor, and pad area. A partial deep silicon etch is performed in the mass remove area not covered by the photoresist 20 and the bottom oxide layer 16, as shown in FIG. 15. The deep silicon etch is timed to stop at about 150 microns deep into the silicon 12.

Figure 16:
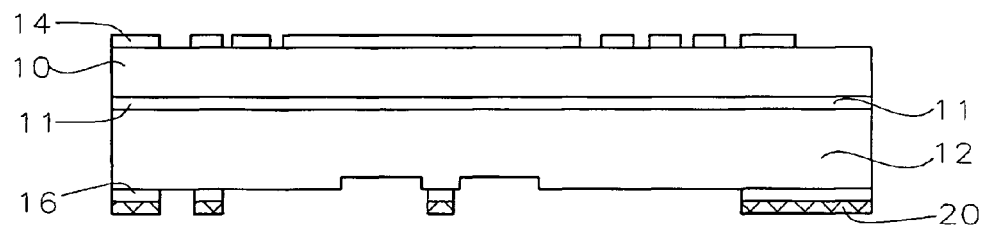

Next, an oxide etch from the backside opens the hard mask 16 for the cavity, anchor, and pad area, as shown in FIG. 16.

Figure 17:
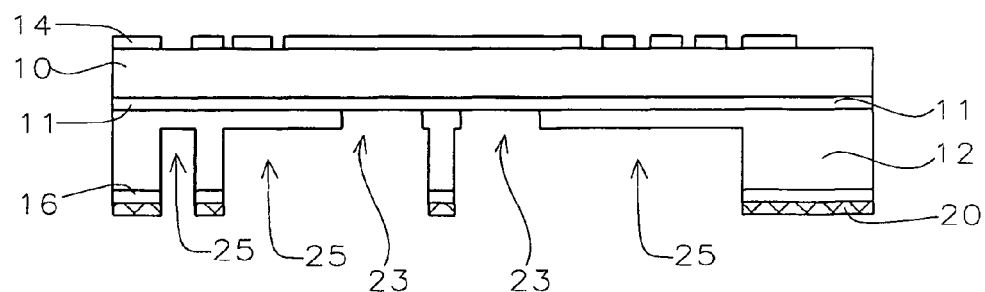

A second deep silicon etch is performed from the backside of the wafer, as shown in FIG. 17. The etch stops at the BOX layer 11 in the mass remove area 23. In the other recessed areas 25, there will be enough silicon 10 remaining to protect the BOX 11 during the next process step.

Figure 18:
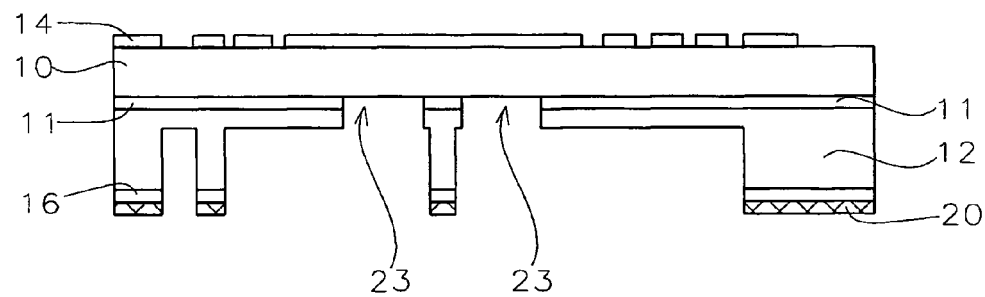
Figure 19:
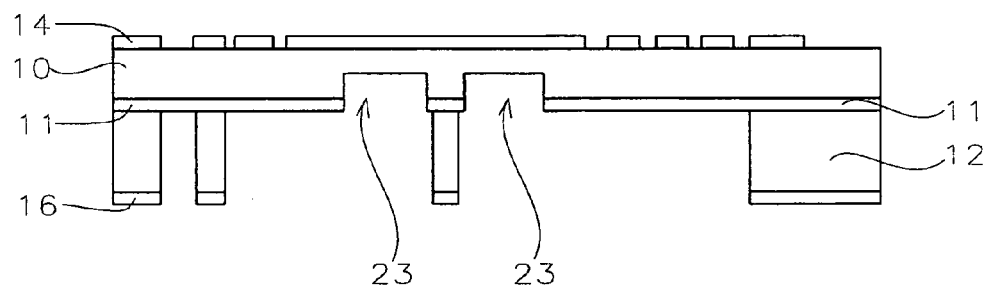

As shown in FIG. 18, the exposed BOX 11 layer is removed by an oxide etch. Next, the photoresist 20 is removed, as shown in FIG. 19. Also shown in FIG. 19 is a third deep silicon etch to remove the remaining silicon 10 not covered by hard mask 16, with a stop at BOX 11. This etching also continues etching of mass remove areas 23 to reach the design thickness, depending on the frequency target.

Figure 20:
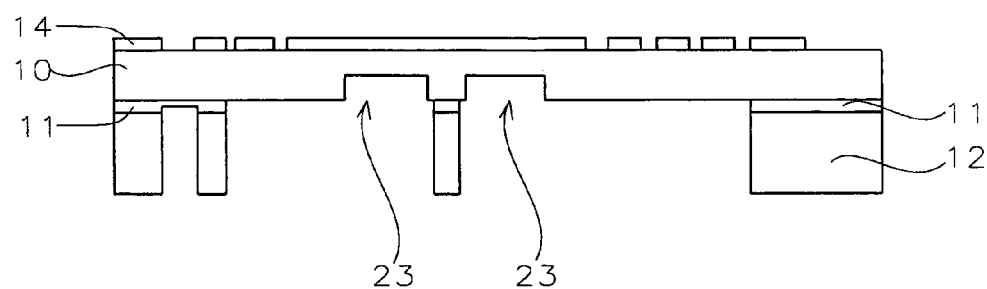
Figure 21:
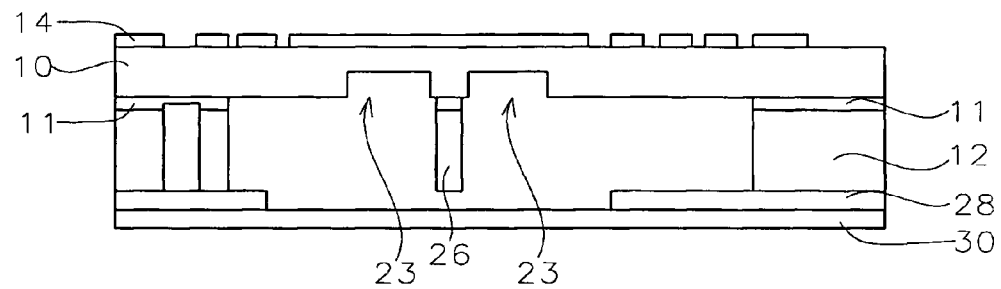

Next, the bottom silicon dioxide layer 16 and exposed BOX 11 are removed by an oxide etch, as shown in FIG. 20. A patterned glass wafer 28 is anodically bonded to the silicon-on-insulator wafer 10/11/12. A silicon wafer 30 is temporarily bonded to the glass wafer 28, as shown in FIG. 21.

Figure 22:
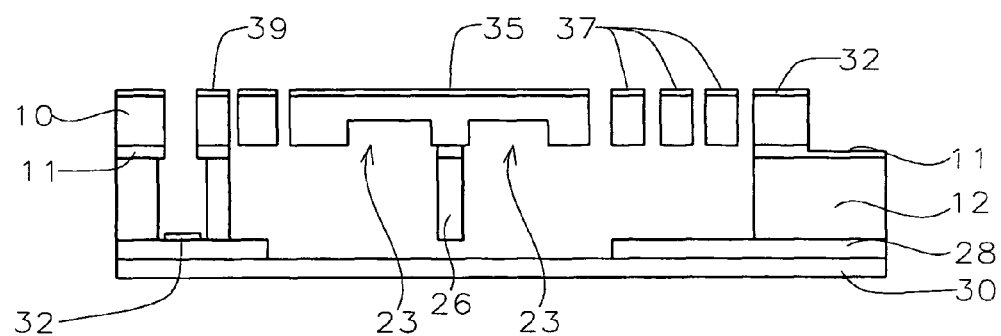

As illustrated in FIG. 22, a deep silicon etch is now performed from the topside of the wafer where the silicon layer 10 is not covered by the hard mask 14. The top silicon dioxide layer 14 is removed, followed by metal deposition 32 to form the MEMS scanning mirror of the invention. FIG. 22 illustrates the mirror 35, comb teeth 37, and the anchor 39.

The present invention provides two methods for forming a MEMS scanning mirror having a particular resonance frequency. The resonance frequency can be tuned to the particular application desired. The particular resonance frequency is set by the mass removal steps of the present invention, using special patterns on the bottom of mirror. This means that the backside etch not only provides a way to control frequency, but also provides a way to make the mirror very stable during high frequency scanning. The mass is removed from the backside of the mirror so as to avoid interfering with the topside mirror structures.

Although the preferred embodiment of the present invention has been illustrated, and that form has been described in detail, it will be readily understood by those skilled in the art that various modifications may be made therein without departing from the spirit of the invention or from the scope of the appended claims.

What is claimed is:

1. A method of fabricating a MEMS scanning mirror having a tunable resonance frequency comprising:
   providing a silicon-on-insulator wafer comprising a top silicon layer, a bottom silicon layer, and a silicon dioxide layer between said top and said bottom silicon layers;
   forming a silicon dioxide hard mask on said bottom silicon layer and patterning said hard mask; and
   etching away portions of said bottom silicon layer and said silicon dioxide layer from a backside of said silicon-on-insulator wafer and etching away portions of said top silicon layer from said backside directly underlying said MEMS scanning mirror to tune the resonance frequency to a particular value wherein a depth of said portions of said top silicon layer is chosen to achieve said particular resonance frequency for said MEMS scanning mirror and wherein said bottom and top silicon layers are etched using said silicon dioxide hard mask and said silicon dioxide layer as hard masks and wherein said silicon dioxide layer is etched using said silicon layer as a hard mask.

2. The method according to claim 1 wherein said silicon-on-insulator wafer comprises said top silicon layer having a thickness of between about 100 and 200 microns, said bottom silicon layer having a thickness of between about 300 and 400 microns, and said silicon dioxide layer having a thickness of about 2 microns.

3. The method according to claim 1 wherein said silicon dioxide hard mask has a thickness of about 2 microns.

4. The method according to claim 1 wherein said etching step comprises reactive ion etching, ion beam etching, or laser beam etching.

5. A method of fabricating a MEMS scanning mirror comprising:
   providing a silicon-on-insulator wafer comprising a top silicon layer, a bottom silicon layer, and a silicon dioxide layer between said top and said bottom silicon layers;
   forming a silicon dioxide hard mask on said bottom silicon layer and patterning said hard mask;
   etching away portions of said bottom silicon layer and said silicon dioxide layer from a backside of said silicon-on-insulator wafer and etching away portions of said top silicon layer from said backside directly underlying said MEMS scanning mirror to set a particular resonance frequency for said MEMS scanning mirror wherein a depth of said top silicon layer etched away is chosen to provide said particular resonance frequency of said MEMS scanning mirror, and wherein said bottom and top silicon layers are etched using said silicon dioxide hard mask and said silicon dioxide layer as hard masks and wherein said silicon dioxide layer is etched using said silicon layer as a hard mask; and
   thereafter patterning said top silicon layer and depositing metal to form said MEMS scanning mirror.

6. The method according to claim 5 wherein said silicon-on-insulator wafer comprises said top silicon layer having a thickness of between about 100 and 200 microns, said bottom silicon layer having a thickness of between about 300 and 400 microns, and said silicon dioxide layer having a thickness of about 2 microns.

7. The method according to claim 5 wherein said silicon dioxide hard mask has a thickness of about 2 microns.

8. The method according to claim 5 wherein said etching step comprises reactive ion etching, ion beam etching, or laser beam etching.

9. A method of fabricating a MEMS scanning mirror comprising:
   providing a silicon-on-insulator wafer comprising a top silicon layer, a bottom silicon layer, and a silicon dioxide layer between said top and said bottom silicon layers;
   forming a top hard mask on said top silicon layer;
   forming a bottom hard mask on said bottom silicon layer having an opening for a mass removal area;
   coating said bottom hard mask and said bottom silicon layer with a photoresist layer and patterning said photoresist layer to provide openings in said mass removal area and in other areas;
   thereafter first partially etching away said bottom silicon layer where it is not covered by said photoresist layer and said bottom hard mask in said mass removal area;
   thereafter removing said bottom hard mask where it is not covered by said photoresist layer;
   thereafter second etching away said bottom silicon layer where it is not covered by said photoresist layer and stopping at said silicon dioxide layer in said mass removal area wherein a portion of said bottom silicon layer remains covering said silicon dioxide layer in all other areas;
   thereafter removing said silicon dioxide layer exposed in said mass removal area and stripping said photoresist layer;
   thereafter third etching away said bottom silicon layer etching into said top silicon layer to a predetermined depth in said mass removal area and stopping at said silicon dioxide layer in said other areas, wherein said predetermined depth is chosen to provide a particular resonance frequency of said MEMS scanning mirror;
   thereafter removing said bottom hard mask;
   thereafter bonding a glass wafer to said bottom silicon layer; and
   thereafter etching through said top silicon layer, removing said top hard mask, and depositing metal to form said MEMS scanning mirror.

10. The method according to claim 9 wherein said silicon-on-insulator wafer comprises said top silicon layer having a thickness of between about 100 and 200 microns, said bottom silicon layer having a thickness of between about 300 and 400 microns, and said silicon dioxide layer having a thickness of about 2 microns.

11. The method according to claim 9 wherein said top and bottom hard masks comprise silicon dioxide and have a thickness of about 2 microns.

12. The method according to claim 9 wherein said first, second, and third etching steps comprise reactive ion etching, ion beam etching, or laser beam etching.

13. The method according to claim 9 wherein said first partial etching step etches into said bottom silicon layer to a depth of about 150 microns.

14. The method according to claim 9 further comprising: temporarily bonding a silicon wafer to said glass wafer.

15. A method of fabricating a MEMS scanning mirror comprising:
- providing a silicon-on-insulator wafer comprising a top silicon layer, a bottom silicon layer, and a silicon dioxide layer between said top and said bottom silicon layers;
- forming a top hard mask on said top silicon layer;
- forming a bottom hard mask on said bottom silicon layer;
- coating said bottom hard mask and said bottom silicon layer with a photoresist layer and patterning said photoresist layer to provide an opening for a mass removal area;
- thereafter first etching away said bottom silicon layer where it is not covered by said photoresist layer in said mass removal area and stopping at said silicon dioxide layer;
- thereafter removing said silicon dioxide layer exposed in said mass removal area and stripping said photoresist layer;
- thereafter second etching away said bottom silicon layer where it is not covered by said bottom hard mask, etching into said top silicon layer in said mass removal area to a predetermined depth, wherein said predetermined depth is chosen to provide a particular resonance frequency of said MEMS scanning mirror, and stopping at said silicon dioxide layer in all other areas;
- thereafter removing said silicon dioxide layer and said bottom hard mask;
- thereafter bonding a glass wafer to said bottom silicon layer; and
- thereafter etching through said top silicon layer, removing said top hard mask, and depositing metal to form said MEMS scanning mirror.

16. The method according to claim 15 wherein said silicon-on-insulator wafer comprises said top silicon layer having a thickness of between about 100 and 200 microns, said bottom silicon layer having a thickness of between about 300 and 400 microns, and said silicon dioxide layer having a thickness of about 2 microns.

17. The method according to claim 15 wherein said top and bottom hard masks comprise silicon dioxide and have a thickness of about 2 microns.

18. The method according to claim 15 wherein said first and second etching steps comprise reactive ion etching, ion beam etching, or laser beam etching.

19. The method according to claim 15 further comprising: temporarily bonding a silicon wafer to said glass wafer.

* * * * *